(12) United States Patent
Sivero et al.

(10) Patent No.: US 7,505,326 B2
(45) Date of Patent: Mar. 17, 2009

(54) PROGRAMMING PULSE GENERATOR

(75) Inventors: Stefano Sivero, Capriate (IT); Mirella Marsella, Pandino (IT); Mauro Chinosi, Burago di Molgora (IT); Giorgio Bosisio, Robbiate (IT)

(73) Assignee: ATMEL Corporation, San Jose, CA (US)

( * ) Notice: Subject to any disclaimer, the term of this patent is extended or adjusted under 35 U.S.C. 154(b) by 309 days.

(21) Appl. No.: 11/554,829

(22) Filed: Oct. 31, 2006

(65) Prior Publication Data

US 2008/0101124 A1     May 1, 2008

(51) Int. Cl.
G11C 11/34     (2006.01)
(52) U.S. Cl. .............. 365/185.18; 365/104; 365/185.17
(58) Field of Classification Search ............ 365/185.18, 365/104, 185.17, 185.13, 189.09, 185.23, 365/185.28
See application file for complete search history.

(56) References Cited

U.S. PATENT DOCUMENTS

| | | | |
|---|---|---|---|
| 4,489,400 A * | 12/1984 | Southerland, Jr. ............ 365/104 |
| 4,646,265 A * | 2/1987 | Takamizawa et al. ....... 365/104 |
| 5,122,792 A | 6/1992 | Stewart |
| 5,198,995 A | 3/1993 | Dennard et al. |
| 5,220,528 A | 6/1993 | Mielke |
| 5,495,186 A | 2/1996 | Kanazawa et al. |
| 5,546,341 A | 8/1996 | Suh et al. |
| 5,614,871 A | 3/1997 | Miyabe |
| 5,856,945 A | 1/1999 | Lee et al. |
| 6,621,758 B2 | 9/2003 | Cheung et al. |
| 6,734,742 B2 | 5/2004 | Muroor |
| 6,878,991 B1 | 4/2005 | Forbes |
| 6,944,068 B2 | 9/2005 | Quader et al. |
| 6,946,882 B2 | 9/2005 | Gogl et al. |
| 6,975,542 B2 | 12/2005 | Roohparvar |
| 7,075,146 B2 | 7/2006 | Forbes |
| 7,093,062 B2 | 8/2006 | Cioaca |
| 7,095,658 B2 | 8/2006 | Cioaca |
| 2002/0003722 A1 | 1/2002 | Kanda et al. |
| 2002/0109535 A1 | 8/2002 | Caliboso |
| 2002/0176291 A1 | 11/2002 | Cheung et al. |
| 2003/0048662 A1 | 3/2003 | Park et al. |
| 2003/0051093 A1 | 3/2003 | Takeuchi |
| 2004/0120200 A1 | 6/2004 | Gogl |
| 2004/0202028 A1 | 10/2004 | Cioaca |
| 2005/0005055 A1 | 1/2005 | Pasotti et al. |
| 2005/0088890 A1 | 4/2005 | Matsunaga |
| 2005/0167743 A1 | 8/2005 | Forbes |
| 2005/0174852 A1 | 8/2005 | Hemink |
| 2005/0180186 A1 | 8/2005 | Lutze et al. |

(Continued)

FOREIGN PATENT DOCUMENTS

EP     536326 B1     6/1990

(Continued)

*Primary Examiner*—Dang T Nguyen
(74) *Attorney, Agent, or Firm*—Fish & Richardson P.C.

(57) ABSTRACT

A signal generator circuit is configured to generate program signals for a memory array. The program signals are applied to word lines in the memory array, and have a transient state based on a coupling characteristic of the word lines and selector gates. The transient state is configured to minimize coupling between the word lines and the gates of the selectors so that a state of each selector remains unchanged during the transient state.

31 Claims, 6 Drawing Sheets

U.S. PATENT DOCUMENTS

| | | |
|---|---|---|
| 2005/0184337 A1 | 8/2005 | Forbes |
| 2005/0226055 A1 | 10/2005 | Guterman |
| 2005/0254309 A1 | 11/2005 | Kwon |
| 2005/0265063 A1 | 12/2005 | Forbes |
| 2006/0002190 A1 | 1/2006 | Roohparvar |
| 2006/0018183 A1 | 1/2006 | De Sandre et al. |
| 2006/0039197 A1 | 2/2006 | Khouri |
| 2006/0044872 A1 | 3/2006 | Nazarian |
| 2006/0092718 A1 | 5/2006 | Cioaca |
| 2006/0098522 A1 | 5/2006 | Cioaca |
| 2006/0187712 A1 | 8/2006 | Roohparvar |
| 2006/0187716 A1 | 8/2006 | Roohparvar |

FOREIGN PATENT DOCUMENTS

| | | |
|---|---|---|
| EP | 436073 A3 | 7/1991 |
| EP | 1087529 A3 | 9/2000 |
| EP | 1087529 B1 | 3/2001 |
| EP | 1526547 A1 | 4/2005 |
| EP | 1573740 B1 | 9/2005 |
| EP | 1598831 A1 | 11/2005 |
| WO | WO91/20074 A1 | 12/1991 |
| WO | WO2004/057619 | 7/2004 |
| WO | WO2004061861 A | 7/2004 |
| WO | WO 2005/081318 | 9/2005 |
| WO | WO 2005/083782 | 9/2005 |
| WO | WO2005/104135 A1 | 11/2005 |

\* cited by examiner

Mq, that correspond to bit locations. Each memory

PROGRAMMING PULSE GENERATOR

BACKGROUND

This disclosure relates to generating control signals for memory devices.

A conventional memory device, such as a flash memory, can comprise a series of bit lines arranged in columns. Each bit line, in turn, is connected to a series of memory strings, and each memory string includes several memory locations, e.g., M1 . . . Mq, that correspond to bit locations. Each memory string has one end coupled to a corresponding bit line by a bit line selector, and another end coupled to a ground selector. Typically the bit lines selector and the ground selector comprise transistors.

The columnar architecture of the bit lines and memory strings results in numerous parallel memory locations. Each memory location has in input terminal, e.g., a gate, and the memory locations are grouped in a row-like fashion by connecting the respective gates of each group of memory locations to a corresponding word line.

To program a selected memory location in the memory device, a memory string that includes the selected memory location is selected by coupling the memory string to a reference voltage, e.g., a ground voltage applied to the bit line, and the input to the memory location is coupled to a program voltage applied to the word line for a period of time sufficient to program the selected memory location. Another voltage of a lesser magnitude, e.g., a pass voltage, is applied to the word lines of memory locations in the memory string that are not to be programmed. Because the memory locations are grouped by rows defined by the word line, however, memory locations in parallel memory strings will also receive the program voltage and pass voltage. To prevent programming in the parallel strings, the corresponding bit line selectors and ground selectors are kept off. The resulting high impedance of the bit line selectors and the ground selectors allows the unselected memory strings to float in response to the capacitive coupling of the world line voltages. This technique, known as "channel boosting," prevents the memory locations in the unselected string from being programmed.

To ensure channel boosting, the bit line selectors corresponding to boosted channels must be kept off. The gate voltages of the bit line selectors, however, may be affected by the capacitive coupling with the word lines. Such coupling can cause the bit line selectors that are supposed to be in an off state to become conductive, resulting in a leakage current that discharges the boosted channel. Should the boosted channel discharge sufficiently, one or more corresponding memory locations may be inadvertently programmed, resulting in data corruption.

SUMMARY

Disclosed herein is a program pulse generator configured to reduce the deleterious effects of the capacitive coupling of word lines to the gates of bit line selectors. In one implementation, a memory device includes a plurality of bit lines and a plurality of selectors connected to the bit lines, and each selector has a corresponding gate. The memory device also includes a plurality of memory strings, and each memory string is connected to a corresponding selector. A plurality of words lines, in turn, is connected to the memory strings. The memory device also includes a signal generator circuit configured to generate program signals on the word lines. The program signals include a transient state based on a coupling characteristic of the word lines and the gates of the selectors. The transient state is configured to minimize coupling between the word lines and the gates of the selectors so that a state of each selector remains unchanged during the transient state.

In another implementation, a program source signal is generated for a memory device. The program source signal is coupled to a reference load having a characteristic impedance corresponding to a memory array in the memory, and a transient characteristic of the program source signal is monitored. The slope of the program source signal based on the monitored transient characteristic is controlled to minimize coupling between word lines and one or more selector gates in the memory array. The program source signal is utilized to generate program signals that are coupled to word lines in the memory array.

Implementations may include one or more of the following features. For example, the reference load may be adjusted based on the magnitude of the program source signal. The magnitude may correspond to a pass signal value to be applied to an unselected word line. The transient characteristic may be controlled by a slope detector, or may be controlled by a controllable current source. In one example implementation, the program source signal may advantageously be utilized to generate control signals of multiple magnitudes, e.g., a program magnitude and a pass magnitude. These and other features may be separately realized by one or more of the implementations described below.

DETAILED DESCRIPTION

Figure 1:
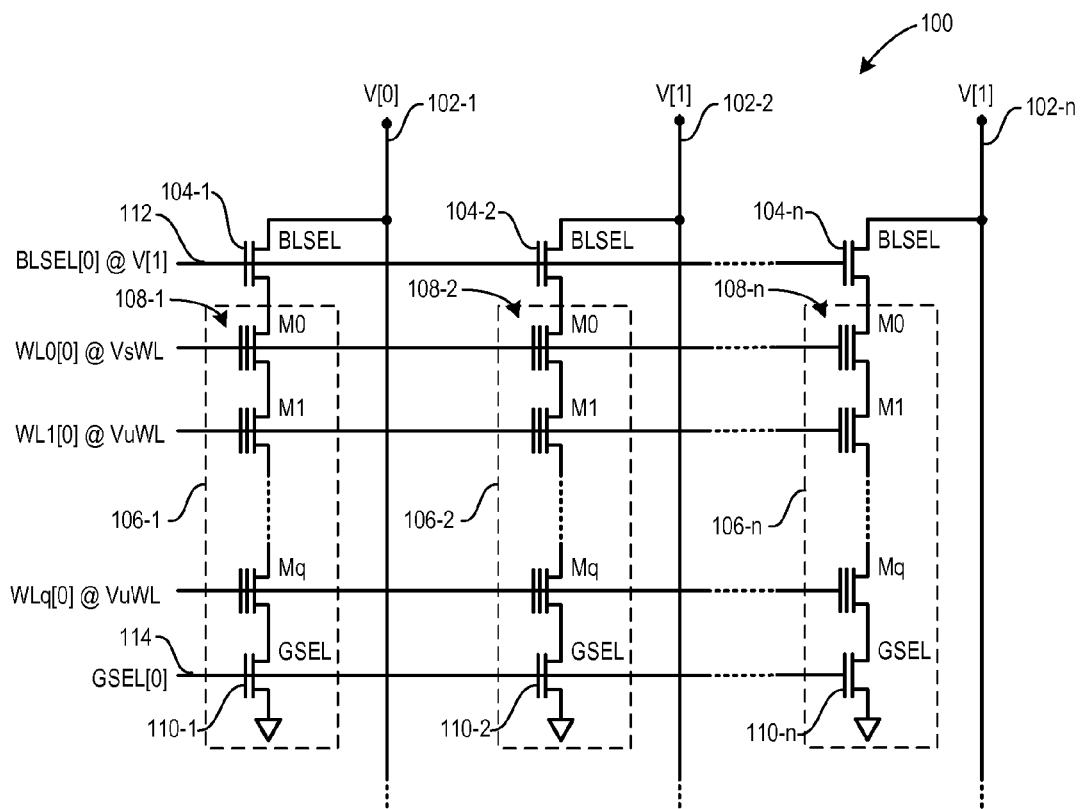
FIG. 1 is a circuit diagram of an example memory array.

Throughout the drawings, the same or similar reference numerals are applied to the same or similar parts and elements, and thus the description of the same or similar parts and elements will be omitted or simplified when possible.

FIG. 1 is a circuit diagram of an example memory array 100. The example memory array 100 can include bit lines 102-1, 102-2 . . . 102-*n* arranged according to a matrix architecture, e.g., in parallel. Coupled to the bit lines 102-1-102*n* are corresponding bit lines selectors 104-1, 104-2 . . . 104-*n*, and coupled to each of the bit line selectors 104-1-104-*n* are corresponding memory strings 106-1, 106-2, . . . 106-n. Each of the memory strings 106-1-106-n includes corresponding groups of memory locations 108-1, 108-2 . . . 108-n. For example, each group 108 can include eight memory locations M0, M1 . . . M7. The uppermost memory locations Mq in each memory string 106-1-106-n are coupled to corresponding ground selectors 110-1, 110-2 . . . 110-n. The memory locations M0-Mq of each of the memory strings 106-1-106-n can be grouped in a row-like fashion by connecting the respective gates of the memory locations M0-Mq to a group of corresponding word lines WL0-WLq. Selector conductors 112 and 114 respectively connect the gates of corresponding bit line selectors 104-1-104-n and ground selectors 110-1-110-n. In one implementation, the memory locations M0-Mq are floating gate MOSFET transistors, and the bit line selectors 104 and ground selectors 110 are MOSFET transistors.

To program a memory location in the memory array 100, a programming pulse is applied on a word line that is connected to the gate of the memory location, and the source and drain of the memory location are maintained at a reference potential, e.g., ground. For example, to program the memory location M0 in the memory string 106-1, a word line select voltage, e.g., VsWL, is applied to the selected word line WL0, and a word line unselect voltage, e.g., VuWL, is applied to the unselected word lines WL1 . . . WLq. The source and drain of the selected memory location, e.g., M0, are kept at a reference voltage V[0], e.g., a ground voltage, by applying the reference voltage V[0] to the bit line 102-1 connected to the bit line selector 104-1, and applying a supply voltage, e.g., V[1], to the selector conductor 112. The program signals VsWL and VuWL rise to the magnitudes of VPGM and VPASS, respectively, and are maintained for a time period that ensures that the memory location M0 is programmed.

Because the word lines WL0-WLq are also connected to the corresponding gate of memory locations M0-Mq in each of the memory strings 106-2-106-n, the memory locations M0-Mq will also be coupled to the program signals VsWL and VuWL. To prevent programming of a memory location, e.g. M0, in the parallel strings 106-2-106-n, the corresponding bit line selectors 104-2-104-n and ground selectors 110-2-110-n are kept off by coupling the supply voltage V[1] to the bit lines 102-2-102-n. The channels of the unselected memory strings 106-2-106-n thus charge to a voltage of approximately V[1]-$V_{th}$, where $V_{th}$ is the threshold voltage of the bit line selectors 104-2-104-n. Thereafter, the bit line selectors 104-2-104-n remain off and the channels of the memory strings 106-2-106-n remain floating. The channels of the unselected memory strings 106-2-106-n may thus float in response the capacitive coupling of the word line voltages WL0-WLq, thereby inhibiting programming of the respective memory locations M0-Mq.

The bit line selectors 104-2-104-n are kept well off, e.g., either reverse biased or unbiased, to ensure channel boosting. If, however, a particular bit line selector 104 begins to turn on, e.g., the gate to source voltage becomes slightly forward biased, then the bit line selector 104 can begin conducting, and the corresponding memory string 106 will thus discharge from the floating potential towards V[1]. As a result, the program signals VsWL and VuWL that are applied to the gates of the memory locations M0-Mq in the discharged memory string 106 may inadvertently program one or more of the memory locations M0-Mq in the discharged memory string 106.

Figure 2:
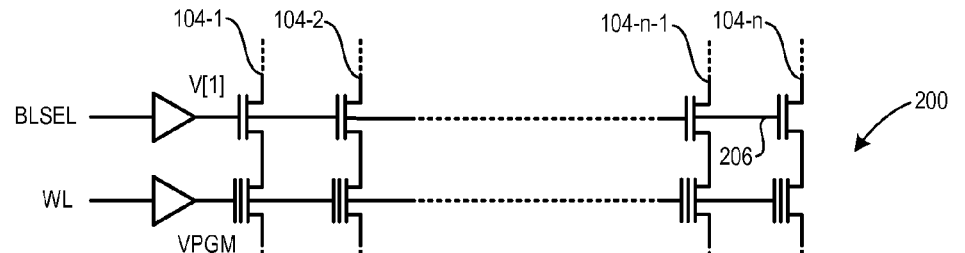
FIG. 2 is a circuit diagram abstraction of a capacitive characteristic of the example memory array.
Figure 2:
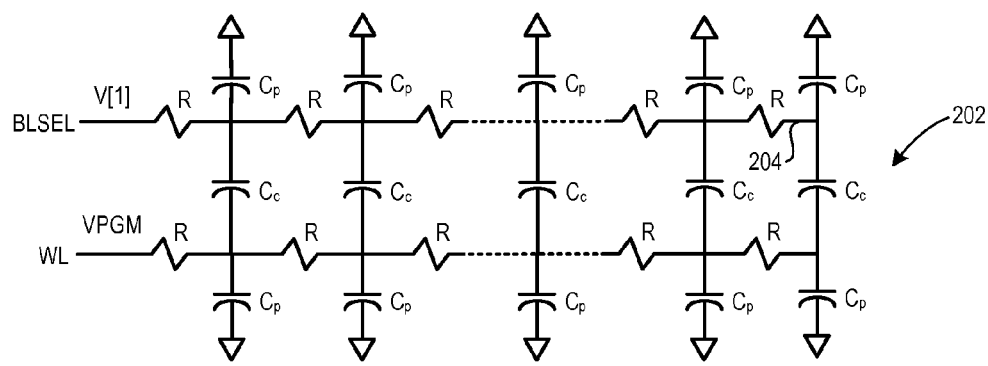

Parasitic coupling between the word lines W0-Wn and the gates of the bit line selectors 104 can impart sufficient voltage on a gate of bit line selector 104 to discharge a boosted memory string 106 as described above. The coupling effect is most pronounced when the program signal VsWL is applied to the lowest order word line, i.e., WL0, that is adjacent the selector conductor 112. This phenomenon is better understood with reference to FIG. 2, which is a circuit diagram abstraction of a capacitive characteristic of the example memory array 100. A first row section 200 of the memory array 100 and a corresponding impedance network 202 are shown. The word lines WL0-WLq and the selector conductor 112 in the memory array 100 can have a high resistance due to the length of the memory array 100. For example, the memory array 100 can comprise 8192 columns, i.e., bit lines 102-1 . . . 102-8192, and thus the total resistance of a word line or selector conductor can be approximately R*8192. Additionally, the word lines and selector conductor also have a distributed parasitic capacitance $C_p$ towards ground and a common coupling capacitance $C_c$.

Thus, when a word line, such as WL0, rises toward VPGM or VPASS, the resistances and the capacitances of the corresponding impedance network 202 can cause the voltages on the gates of the corresponding bit line selectors 104 to rise above V[1]. The coupling effect will be most pronounced near the terminus of the memory array 100, e.g., near the location 204 in the impedance network 202, which corresponds to the gate 206 of the bit line selector 104-n. For example, in one implementation, the VPGM pulse has a magnitude of 18 V, the VPASS voltage has a magnitude of 10 V and the supply voltage V[1] has a magnitude of 3 V. Accordingly, a coupling of only a few mV can be induced, which can cause one or more of the bit line selectors 104 to conduct a leakage current.

Such a leakage current, even if relatively small, can degrade channel boosting. For example, in an example NAND flash memory array, the program signals VsWL and VuWL have pulse durations of approximately 10 µs. A memory string 106 can have a capacitance of about 1 fF, and thus a current of approximately 1 nA can discharge a memory string 106 by approximately 10 V.

Figure 3:
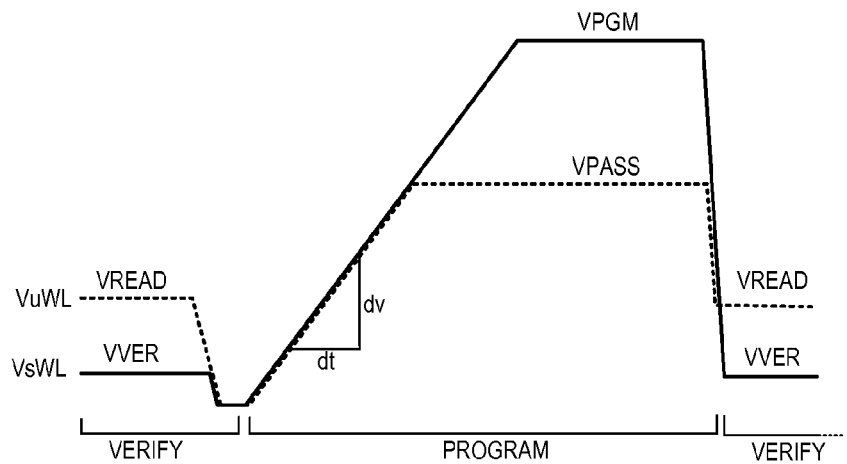
FIG. 3 is a timing diagram of example program signals utilized in the example memory array.

FIG. 3 is a timing diagram of example program signals utilized in the example memory array 100. In the example implementation of FIG. 3, the program signals VuWL and VsWL transition through a verify phase and a read phase. During the verify phase, a verification of the memory location to be programmed is performed. The gates of the memory locations in the string containing the memory location to be programmed are biased at a VREAD potential, and the gate of the location to be verified is biased at a VVER potential. In one example implementation, a read voltage of 0 V is utilized to read memory locations during normal read operations; and the VREAD magnitude is 5 V and the VVER potential is 1 V during the programming operation. Selecting the VREAD magnitude at 5V ensures that the unselected memory locations, i.e., the memory locations not to be programmed, are fully turned on and that the drains and sources of the unselected locations are correctly biased. Selecting the VVER magnitude at 1V ensures that the selected memory location, i.e., the memory location to be programmed, is read at a voltage having an error margin during the programming operation.

After the verify phase, the program signals VuWL and VsWL are reduced to the reference potential, e.g., ground, to discharge the word lines WL1-WLq towards the reference potential. Thereafter, the program signals VuWL and VsWL rise to VPASS and VPGM, respectively, and are maintained for a duration to ensure that the selected memory location is programmed. For example, if the memory array 100 comprises NAND flash memory, the program signals VuWL and VsWL can be maintained at VPASS and VPGM for approximately 10 µs to ensure sufficient injection of electrons into a floating gate of the selected memory location.

After the program phase, another verify phase is performed to verify that the selected memory location has been properly programmed. If the memory location has not been properly programmed, another program phase can be performed.

The greater the slope of dv/dt of the program signals VsWL and VuWL, the greater the possible coupling with the gates of the bit line selectors 104. Accordingly, a signal generator generates program signals having a transient state based on a coupling characteristic of the word lines WL0-WLq and the gates of the selectors 104-1-104-$n$. The transient state can be configured to minimize coupling between the word lines WL0-WLq and the gates of the selectors 104-1-104-$n$ so that a state of each selector 104 remains unchanged during the transient state. For example, in FIG. 1, the bit line selector 104-1 is biased on, and the remaining bit line selectors 104-2-104-$n$ are biased off. Applying the program signals VsWL and VuWL of FIG. 3 having a transient state based on a coupling characteristic of the word lines WL0-WLq and the gates of the selectors 104-1-104-$n$ ensures that the bit line selectors 104-2-104-$n$ remain biased off.

Figure 4:
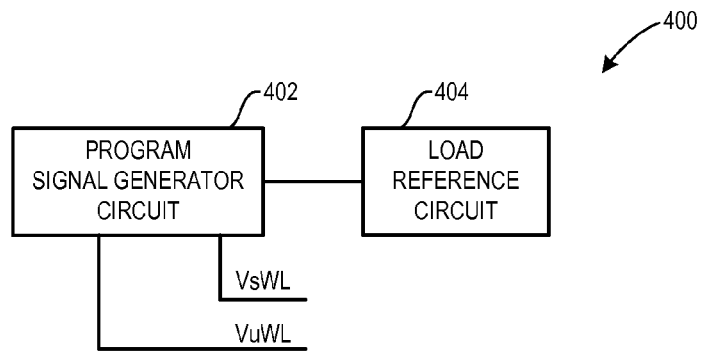
FIG. 4 is a block diagram of an example signal generator configured to generate the program signals.

FIG. 4 is a block diagram of an example signal generator 400 configured to generate the program signals of FIG. 3 during the program phase. The example signal generator 400 includes a program signal generator circuit 402 coupled to a reference load circuit 404.

In one implementation, the reference load circuit 404 can be realized by an impedance circuit having an impedance corresponding to the one or more word lines WL0-WLq and/or the impedance of selector conductor 112 that is coupled to the bit line selectors 104. For example, the reference load circuit 404 can have a characteristic impedance corresponding to one or more word lines WL0-WLq and/or the impedance of the selector conductor 112 that is coupled to the bit line selectors 104. In some implementations, the reference load circuit 404 can be realized by dummy word lines and dummy selectors coupled to a dummy selector line.

The program signal generator circuit 402 is coupled to the reference load circuit 404 and is configured to generate a program source signal having a controlled transient state. The program source signal is utilized to generate the program signals VsWL and VuWL during the program phase. In some implementations, the program signal generator circuit 402 is a closed-loop control circuit. In other implementations, the program signal generator circuit 402 is an open-loop control circuit. The feedback architectures can be either static or dynamic. In some implementations, the program source signal is a current-controlled signal.

Figure 5:
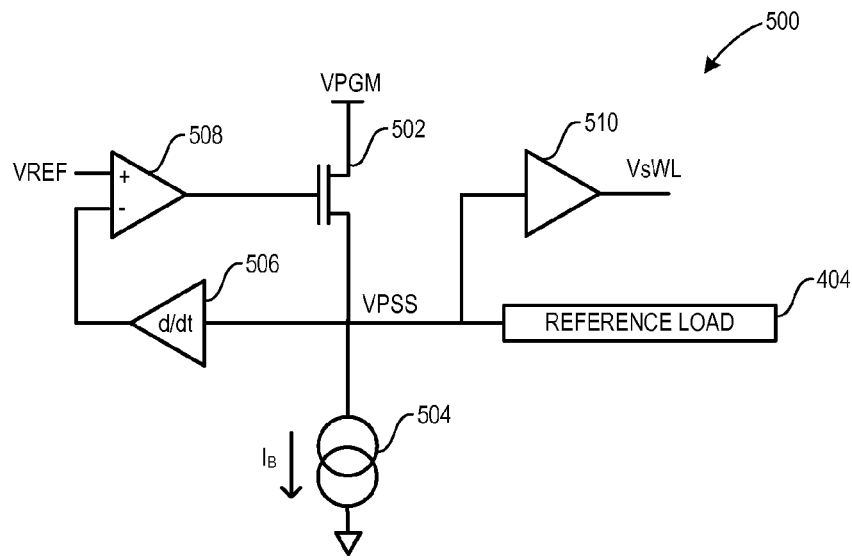
FIG. 5 is an example implementation of the signal generator.

FIG. 5 is an example implementation of a signal generator 500. The example signal generator 500 may be utilized as the signal generator 400 of FIG. 4, and implements a closed-loop architecture.

A drive circuit 502 charges a reference load circuit 404 to generate a program source signal VPSS. In one implementation, the drive circuit 502 is a transistor coupled to a supply voltage having a magnitude of VPGM, and the supply voltage VPGM charges the reference load circuit 404 through the transistor 502 to generate the program source signal VPSS. In this implementation, a current source 504 can be used to produce a bias current $I_s$ to bias the transistor in an on state. Other drive circuits 502 can also be used.

The output of the driver circuit 502 causes the program source signal VPSS to rise according to the RC characteristic of the reference load circuit 404. The rising slope of the program source signal VPSS is monitored by a slope detector 506 that is configured to receive the program source signal VPSS from the reference load circuit 404 and generate a control signal. In one implementation, the slope detector 506 is a differentiator. Other slope detectors 506 can also be used.

The slope detector 506 generates the control signal that is provided to an error detector 508. The error detector 508 compares the control signal to a reference VREF, and generates an error signal that is provided as an input to the drive circuit 502. The output of the drive circuit 502, in turn, is adjusted in response to the error signal to control the slope of the program source signal VPSS. A buffer circuit 510 is coupled to the reference load circuit 404 and outputs the program source signal VPSS as the word line select program signal VsWL during the program phase.

The slope of the program source signal VPSS is controlled by the reference voltage VREF. In one implementation, the reference voltage VREF is a fixed voltage and is based on an estimated or measured capacitive coupling between the word lines W0-Wn and the gates of the bit line selectors 104-1-104-$n$. The voltage can be fixed according to design specifications, and can be selected to produce a transient characteristic dv/dt to accommodate for process variations. In other implementations, the voltage VREF can be adjusted based on the output of a feedback device, e.g., an error detector can be configured to determine if inadvertent memory locations are programmed and adjust the voltage VREF to reduce the slope of the program source signal VPSS. Other processes to generate or determine the magnitude of the voltage reference VREF can also be used.

In another implementation, a similar signal generator 500 can be used to generate the program signal for the unselected word lines, i.e., VuWL. In one implementation, the drive circuit of another signal generator 500 can be connected to a supply voltage have a magnitude of VPASS to generate the program signal VuWL, and a reference load circuit having an impedance corresponding to the unselected word lines can be coupled to the output of the drive circuit.

Figure 6:
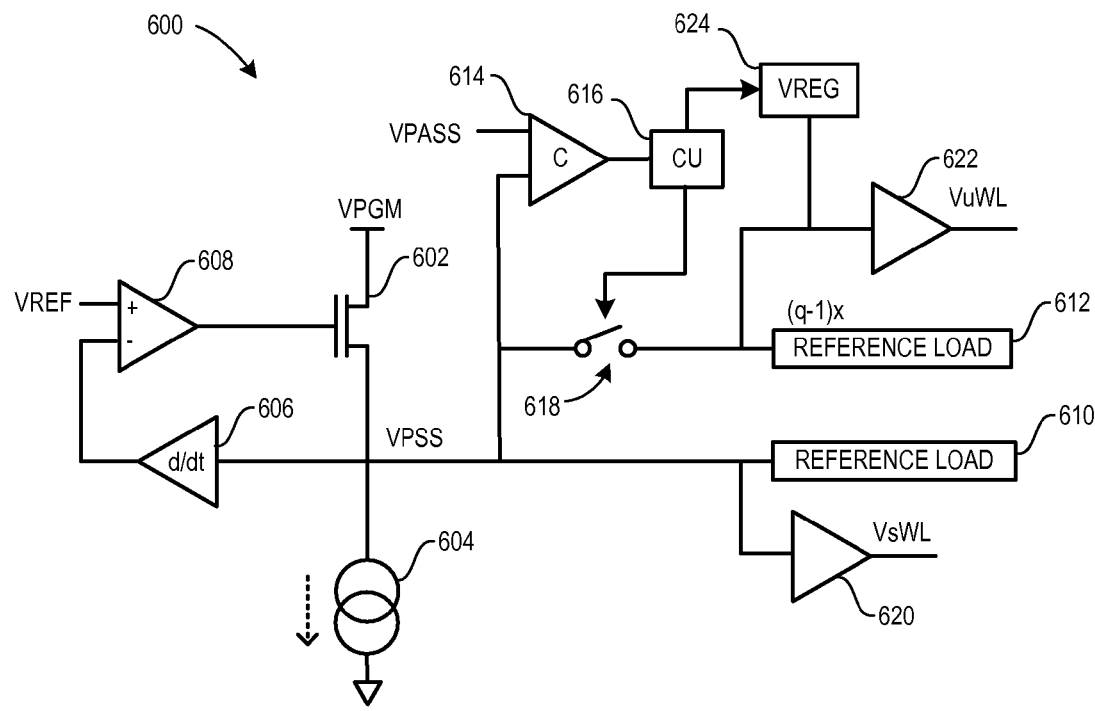
FIG. 6 is another example implementation of the signal generator.

FIG. 6 is another example implementation of a signal generator 600. The example signal generator 600 may be utilized as the signal generator 400 of FIG. 4. The signal generator 600 is similar to the signal generator 500 in that the drive circuit 602, the current source 604, the slope detector 606 and the error amplifier 608 operate in a similar manner to the driver circuit 502, the current source 504, the slope detector 506 and the error amplifier 508 of FIG. 5. In the signal generator 600 of FIG. 6, however, the reference load circuit includes a first reference load circuit 610 and a second reference load circuit 612. The first reference load circuit 610 corresponds to a word line to which a memory location to be program is coupled, and the second reference load circuit 612 corresponds to the remaining word lines. In one implementation, the reference load circuits 610 and 612 are dummy word lines, and the second reference load circuit 612 comprises q-1 dummy word lines, where q is the number of memory locations in each memory string 106.

During operation, the slope of the program source signal VPSS is controlled by the drive circuit 602, the current source 604, the slope detector 606 and the error amplifier 608 in the same manner as described with reference to FIG. 5. The magnitude of the program source signal VPSS is compared to a reference voltage, e.g., a voltage having a magnitude of VPASS, by a comparator 614. While the program source signal VPSS is less than the reference voltage VPASS, the comparator 614 outputs a first signal to a control unit 616 that maintains a switch 618 in a closed position to couple the reference load circuits 610 and 612 together. In one implementation, the control unit 616 and the switch 618 can be realized by a transistor. In another implementation, the control unit 616 and the switch 618 can be realized by separate components.

While the switch 618 remains closed, the program source signal VPSS is buffered by the buffers 620 and 622, which output the program signals VsWL and VuWL, respectively. Thus, the programs signals VsWL and VuWL rises at the same dv/dt rate.

When the program source signal VPSS reaches the magnitude of VPASS, however, the comparator 614 generates a second signal, which causes the control unit 616 to open the switch 618. A voltage regulator 624 coupled to the control unit 616 can be used to maintain the voltage on the reference load circuit 612 at VPASS after the reference load circuit 612 is disconnected. Accordingly, the second reference load circuit 612 is disconnected from the drive circuit 602, and the buffer circuit 622 thus outputs the program signal VuWL at the magnitude VPASS. The first reference load circuit 610, however, remains coupled to the drive circuit 602, and rises in the same dv/dt rate to the program pulse value of VPGM.

Figure 7:
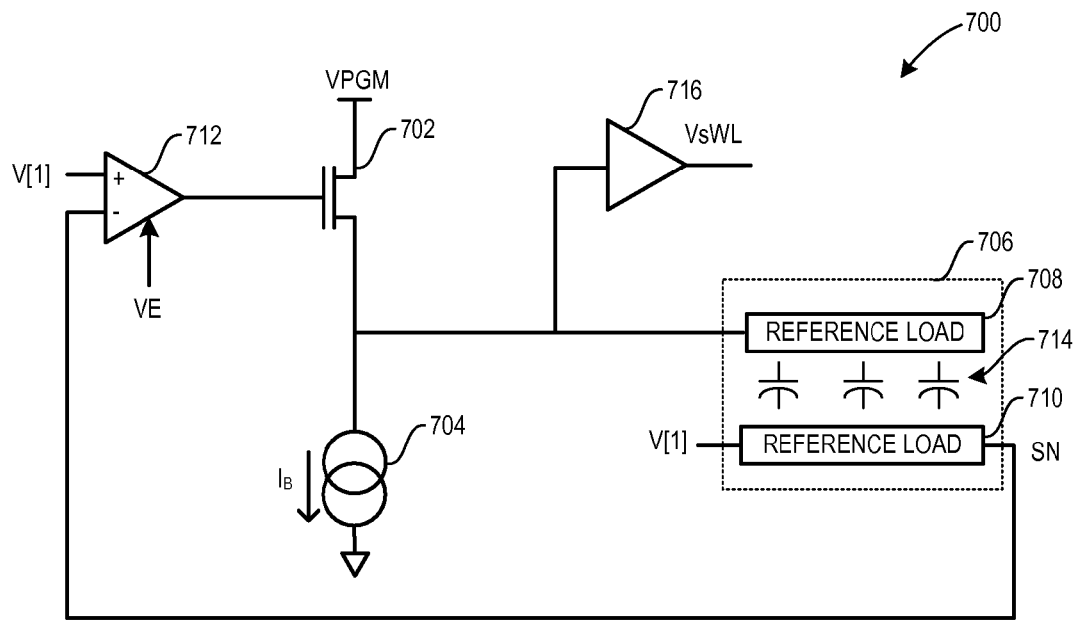
FIG. 7 is another example implementation of the signal generator.

FIG. 7 is another example implementation of a signal generator 700. The example signal generator 700 may be utilized as the signal generator 400 of FIG. 4, and implements a closed-loop adaptive architecture.

The output of the drive circuit 702 is coupled to a reference load circuit 706 to generate the program source signal VPSS. In one implementation, the drive circuit 702 is a transistor coupled to a supply voltage having a magnitude of VPGM, and the supply voltage VPGM charges a reference load circuit 706 through the transistor 702 to generate the program source signal VPSS. In this implementation, a current source 704 can be used to produce a bias current $I_B$ to bias the transistor in an on state. Other drive circuits 702 can also be used.

The load circuit 706 includes a first reference load circuit 708 and a second reference load circuit 710. The first reference load circuit 708 is coupled to the output of the drive circuit 702, and the second reference load circuit 710 is coupled as an input to an error amplifier 712. In one implementation, the first reference load circuit 708 can be realized by a dummy word line, and the second reference load circuit 710 can be realized by dummy bit line selectors coupled together through a selector conductor, and the respective couplings to the drive circuit 702 and the error amplifier 712 are on opposite ends of the first and second reference load circuits 708 and 710. Other load circuits can also be used.

The first and second reference load circuits 708 and 710 are capacitive coupled though a parasitic capacitance 714 that corresponds to the parasitic capacitance between one or more of the word lines W0-Wn and the gates of the bit line selectors 104-1-104-n of the memory array 100. In one implementation, a first end of the second reference load circuit 710 can be coupled to a supply voltage V[1], e.g., $V_{dd}$, and an output SN on the second end of the second reference load circuit 710 corresponds to a capacitively coupled voltage on the gate of a distant bit line selector 104, e.g., the bit line selector 104-n.

The error amplifier 712 compares the output SN to the supply voltage V[1], and produces an error signal that controls the drive circuit 702. The output of the drive circuit 702 is thus controlled to ensure that the coupling as indicated by the output signal SN is less than a fixed value, represented by a reference signal VE. In one implementation, the fixed value can be selected to ensure that the capacitively coupled voltage represented by the output signal SN does not exceed a magnitude that induces a leakage current to discharge a boosted memory string 106.

The program source signal VPSS is buffered by a buffer circuit 716 to produce the word line select program signal VsWL during the program phase. In other implementations, the signal generator 700 can also be adapted to produce the word line unselect program signal VuWL in a similar manner as described with respect to FIGS. 5 and 6, e.g., a duplicate circuit having a drive circuit 702 supply voltage of VPASS, or a similar circuit with an adjustable reference load circuit and a switching circuit.

Figure 8:
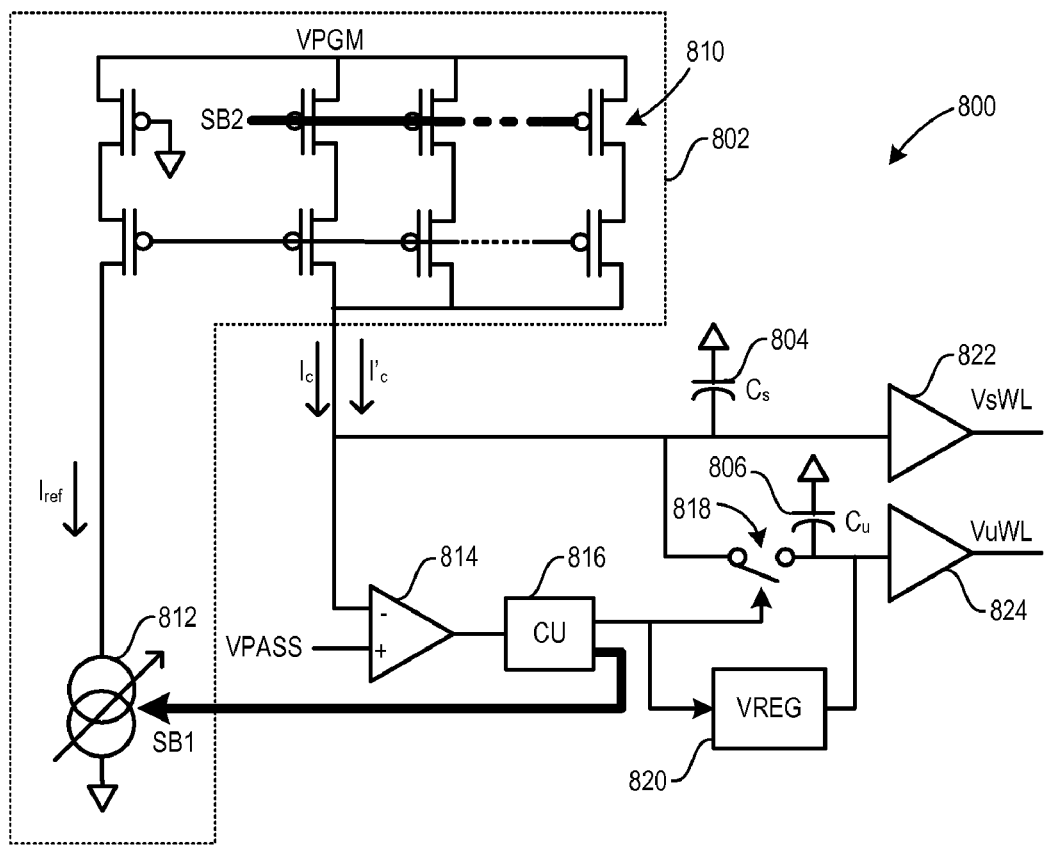
FIG. 8 is another example implementation of the signal generator.

FIG. 8 is another example implementation of a signal generator 800. The example signal generator 800 may be utilized as the signal generator 400 of FIG. 4, and implements an open-loop architecture.

A controllable current source circuit 802 generates a charge current $I_c$ that is used to charge first and second reference load circuits 804 and 806. In one example implementation, the controllable current source 802 includes a current mirror 810 and an adjustable current source 812. The current mirror 810 amplifies a reference current $I_{ref}$ that is generated by adjustable current source 812 to produce the charge current $I_c$. Other controllable current source circuits can also be used.

In one implementation, the reference load circuits 804 and 806 can be realized by capacitive loads $C_s$ and $C_u$, respectively. The capacitive loads $C_s$ and $C_u$ can correspond to the parasitic capacitances of the selected and unselected word lines, respectively.

The charging current $I_c$ is coupled to the capacitive loads $C_s$ and $C_u$ to produce the program source signal VPSS during the program phase. In one implementation, the slope of the program source signal VPSS at the beginning of the program phase can be controlled by setting the slope equal to the charging current $I_c$ divided by the total of the capacitive load, i.e., $dv/dt=I_c/(C_s+C_u)$.

In one implementation, the magnitude of the program source signal VPSS is compared to a reference voltage, e.g., VPASS, by a comparator 814. While the program source signal VPSS is less than the reference voltage VPASS, the comparator 814 outputs a first signal to a control unit 816. The control unit 816 maintains a switch 818 in a closed position to couple the reference load circuits 804 and 806 together.

In one implementation, the control unit 816 can also generate a control signal SB1 that adjusts the adjustable current source 812, which, in turn, adjusts the magnitude of the charging current $I_c$. Thus, while the program source signal VPSS is less than the magnitude of VPASS, the charging current $I_c$ is adjusted a first current value to ensure a constant slope, i.e., $I_c=(dv/dt)*(C_s+C_u)$. A pair of buffer circuits 822 and 824 receive the program source signal VPSS and output the corresponding program signal VsWL and VuWL.

When the magnitude of the program source signal VPSS exceeds the reference voltage VPASS, the comparator 814 outputs a second signal that causes the control unit 816 to open a switch 818 to isolate the reference load circuit 806. A voltage regulator 820 coupled to the control unit 816 can be used to maintain the voltage on the reference load circuit 806 at VPASS after the reference load circuit 806 is disconnected.

The control unit 816 also adjusts the adjustable current source 812 in response to the second signal generated by the comparator 814, which, in turn, adjusts the charging current $I_c$. To ensure that the slope of the program source signal VPSS remains constant, the charge current is reduced by a factor of $(C_s+C_u)/C_s$, i.e., the adjusted charging current $I'_c=(dv/dt)*C_s=I_c*C_s/(C_s+C_u)$. Thereafter, the reference load circuit continues to charge up to the value of VPGM at the controlled dv/dt rate.

In one implementation, control signals SB2 are static. For example, the control signal SB2 can be chosen based on simulation results and trimmed according to choose the proper slope of dv/dt together with the SB1 control signal. Additionally, the control signal SB2 can also be trimmed if the simulation results are further subject to process variations.

Figure 9:
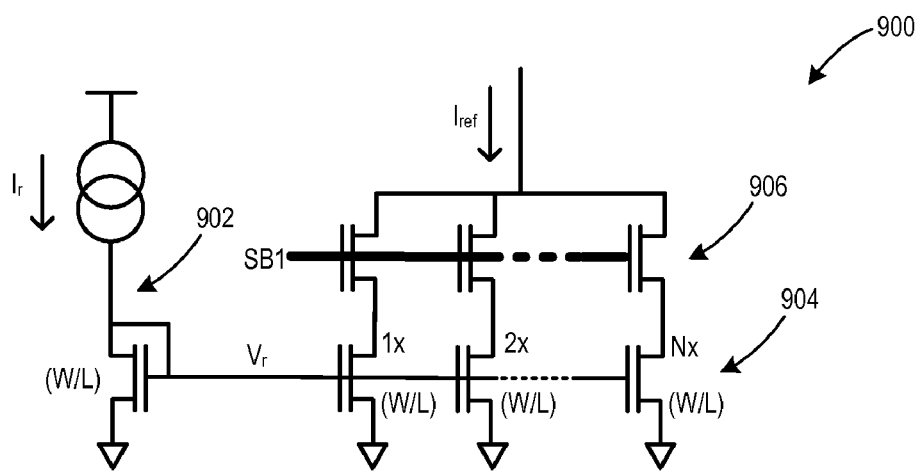
FIG. 9 is example adjustable current source that can be utilized in the example signal generator of FIG. 8.

FIG. 9 is example adjustable current source 900 that can be utilized in the example signal generator of FIG. 8. The adjustable current source 900 can be utilized as the adjustable current source 812 of FIG. 8. The adjustable current source 900 generates a reference voltage $V_r$ from a temperature invariant current reference $I_r$. The reference voltage is applied to the gates of the parallel transistors 904 having a various W/L ratios. The parallel transistors 904 are, in turn, controlled by corresponding switches 906. The switches 906 receive the control signal SB1 from the control unit 816 to control the value of the current $I_{ref}$ accordingly.

Figure 10:
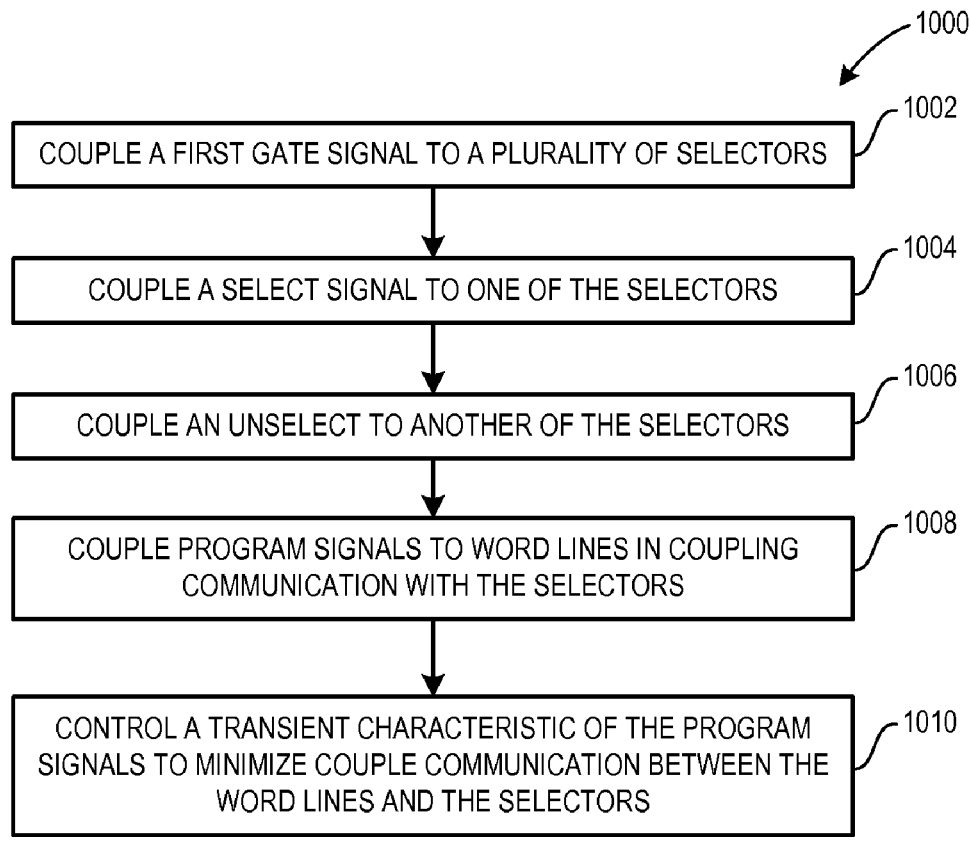
FIG. 10 is a flow diagram of an example process for programming a memory device.

FIG. 10 is a flow diagram of an example process 1000 for programming a memory device. The example process 1000 can be implemented, for example, in a NAND flash memory array.

Stage 1002 couples a first gate signal to a plurality of selectors. For example, a supply voltage V[1] can be coupled to the selector conductor 112 of FIG. 1.

Stage 1004 couples a select signal to one of the selectors. For example, a reference voltage V[0], e.g., ground, can be connected to the source of a bit line selector 104, such as the bit line selector 104-1 of FIG. 1.

Stage 1006 couples an unselect signal to another of the selectors. For example, a supply voltage V[1], e.g., $V_{dd}$, can be connected to the source of another bit line selector 104, such as the bit line selector 104-n of FIG. 1.

Stage 1008 couples program signals to the word lines in coupling communication with the selectors. For example, the word lines W1-Wn of FIG. 1 can be coupled to the program signals VuWL and VsWL.

Stage 1010 controls a transient characteristic of the program signals to minimize coupling communication between the word lines and the selectors. For example, any of the circuits of FIGS. 4-8 can control the transient characteristics of the program signals to minimize coupling communication between the word lines W0-Wn and the selectors 104-1-104-n.

Figure 11:
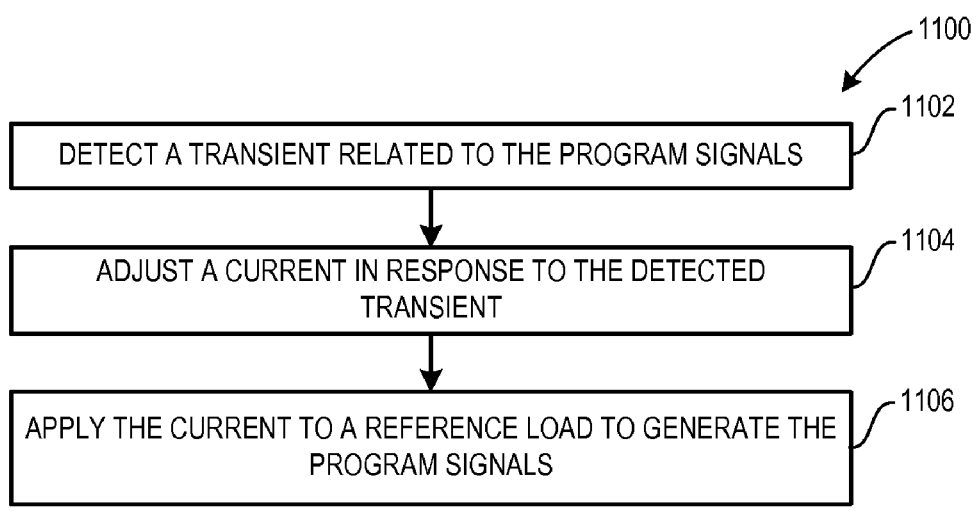
FIG. 11 is a flow diagram of an example process for controlling a transient characteristic of a program source signal.

FIG. 11 is a flow diagram of an example process 1100 for controlling a transient characteristic of a program source signal. The example process 1100 can be implemented, for example, in a NAND flash memory array.

Stage 1102 detects a transient related to the program signals. For example, in one implementation, a slope detector, such as the slope detector 606 of FIG. 6, can detect a slope of the program source signal VPSS that is used to generate the program signals. In another implementation, a reference load voltage can be monitored, as described with respect to the reference load circuit 710 of FIG. 7. In another implementation, the magnitude of the program source signal VPSS can be monitored by the comparator 814 of FIG. 8.

Stage 1104 adjusts a current in response to the detected slope. For example, in one implementation, the conductivity of the drive circuit 602 of FIG. 6 is adjusted in response to the detected slope, which, in turn, adjusts a charge current. In another implementation the conductivity of the drive circuit 702 of FIG. 7 is adjusted in response to the reference load voltage. In another implementation, the charge current $I_c$ is adjusted in response to the magnitude of the program source signal VPSS by the controlled current source 802 of FIG. 8.

Stage 1106 applies the current to a reference load to generate the program signals. For example, in one implementation, the output of the drive circuit 602 is provided to the reference load circuit 610 of FIG. 6. In another implementation, the output of the drive circuit 702 of FIG. 7 is provided to the reference load circuit 708 of FIG. 7. In another implementation, the charge current $I_c$ is provided to the reference load circuit 804 of FIG. 8.

Figure 12:
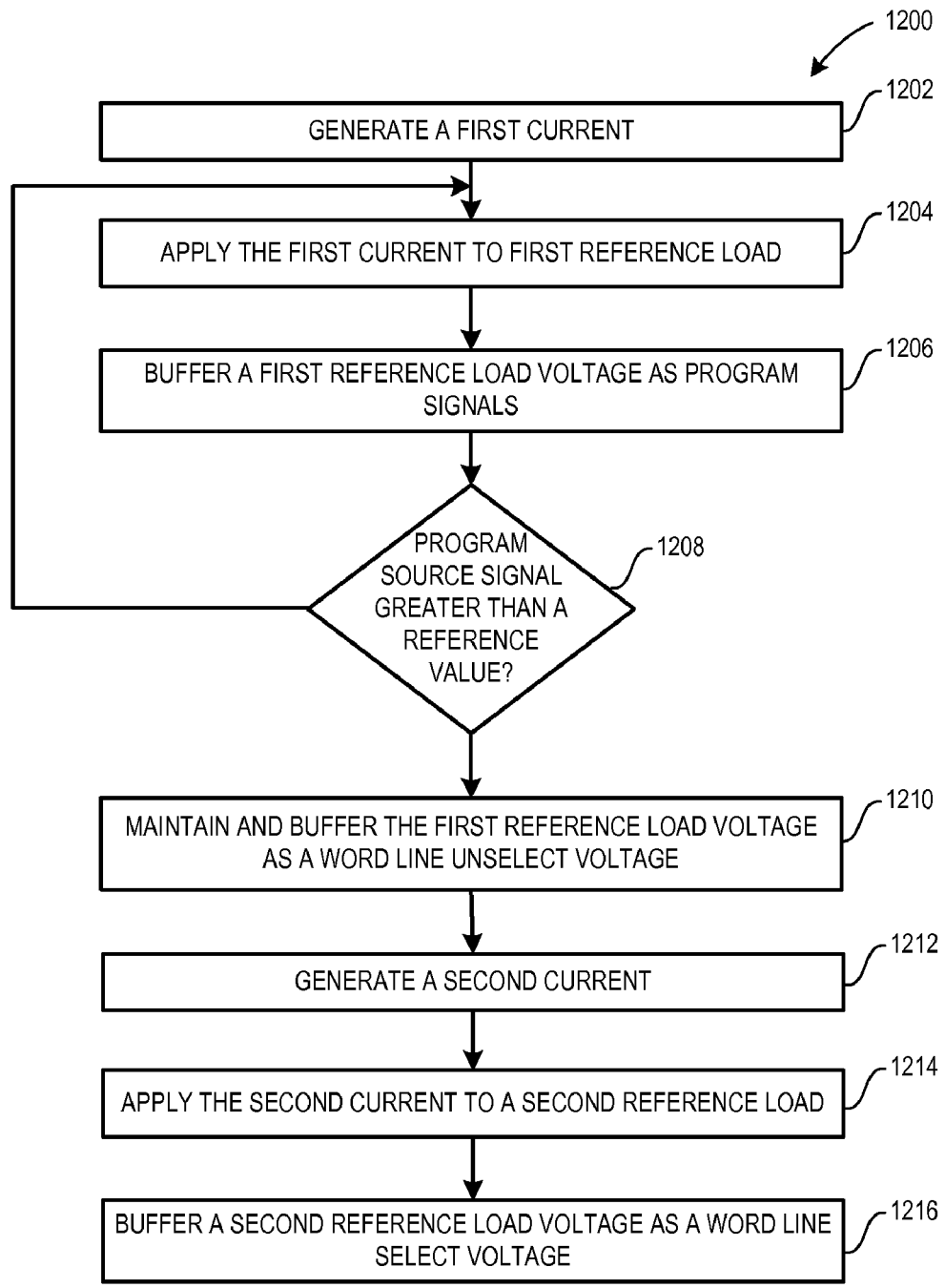
FIG. 12 is a flow diagram of another example process for controlling a transient characteristic of a program source signal.
Figure 10:
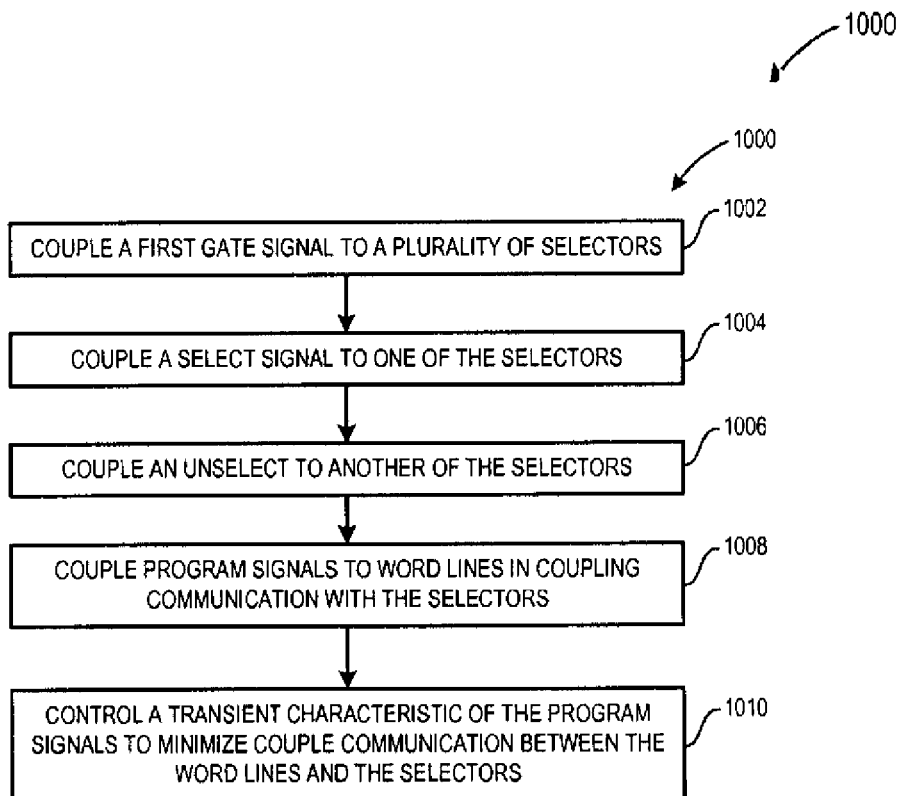
Figure 11:
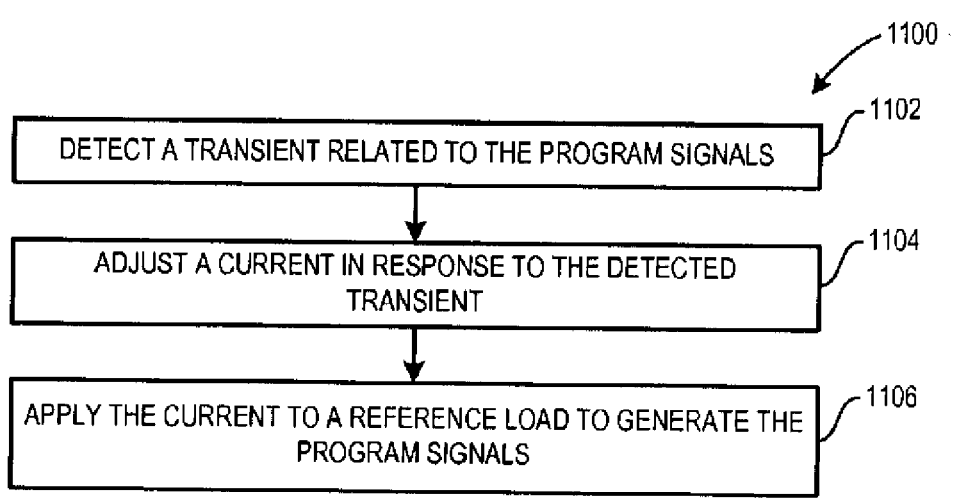
Figure 10:
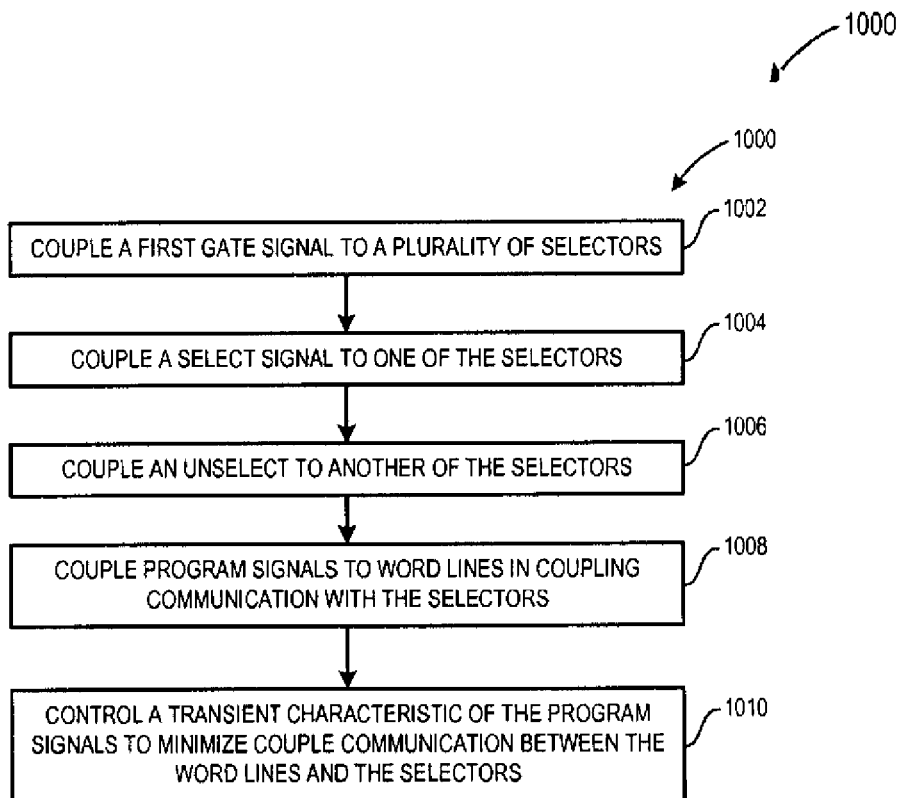
Figure 11:
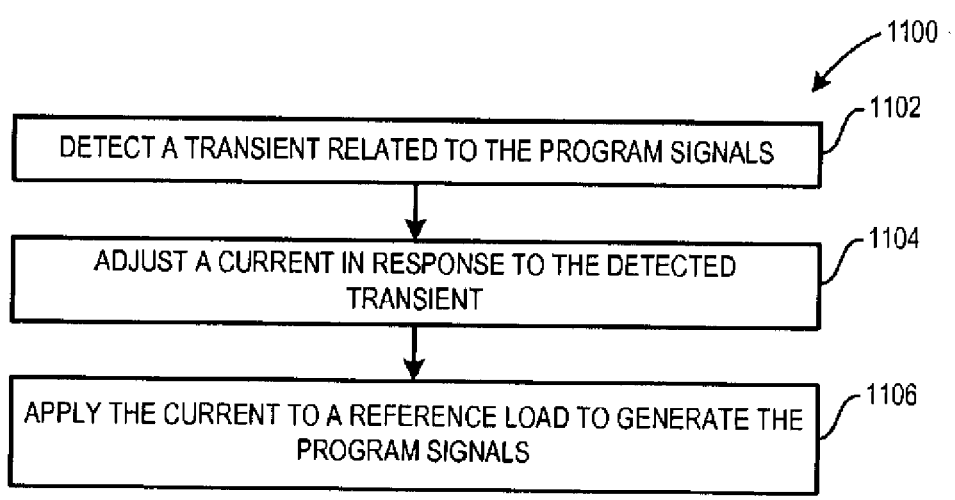
Figure 10:
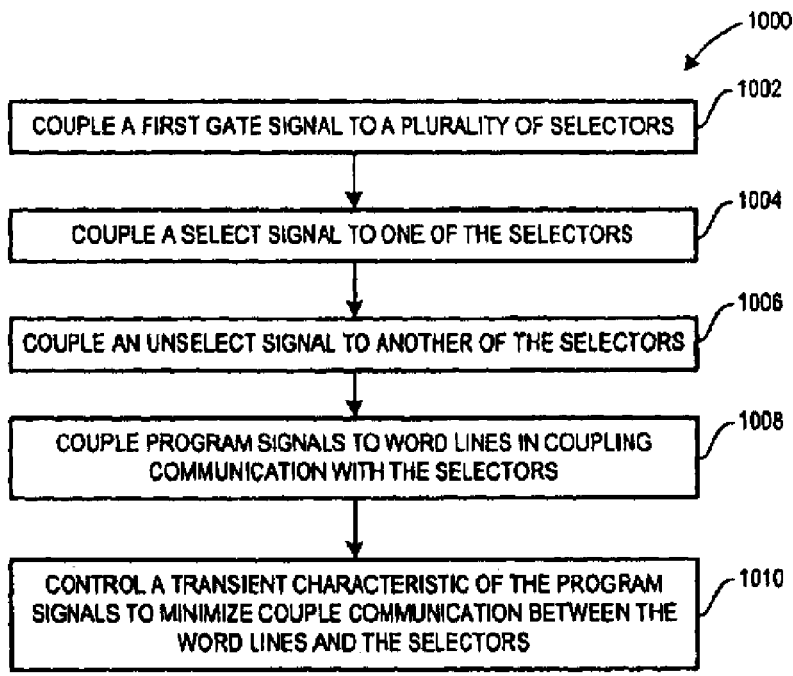
Figure 11:
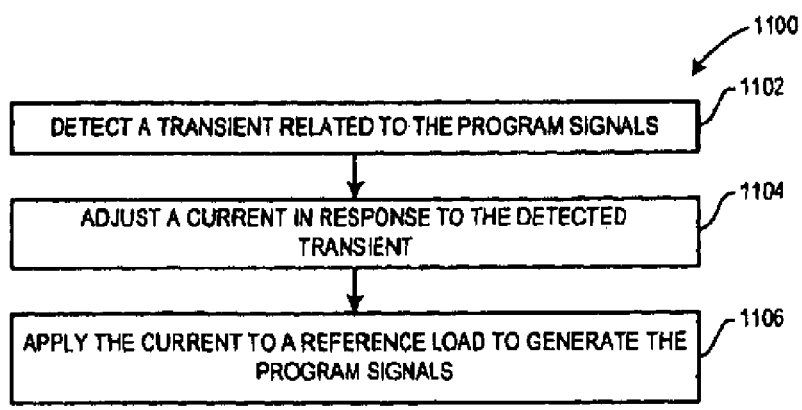

FIG. 12 is a flow diagram of another example process 1200 for controlling a transient characteristic of a program source signal. The example 1200 can be implemented, for example, in a NAND flash memory array.

Stage 1202 generates a first current. For example, the controllable current source 802 of FIG. 8 can generate the current $I_c$.

Stage 1204 applies the first current to a first reference load. For example, the first current $I_c$ can be coupled to a first reference load that includes the reference load circuits 804 and 806 of FIG. 8.

Stage 1206 buffers a first reference load voltage as program signals. For example, the buffers 822 and 824 of FIG. 8 can buffer the voltages of the reference load circuits 804 and 806 and output the buffered voltages as VsWL and VuWL, respectively.

Stage 1208 determines if the program source signal is greater than a reference value. For example, the comparator 814 of FIG. 8 compares the program source signal VPSS to the voltage reference VPASS to determine whether the program source signal VPSS exceeds VPASS. If the program source signal is determined not to be greater than the reference value, then the process returns to stage 1204.

If the program source signal is determined to be greater than the reference value, however, then stage 1210 maintains and buffers the program signals (e.g., the first reference load voltage as a word line unselect voltage). For example, the switch 818 of FIG. 8 is opened; the voltage regulator 820 maintains the voltage on the reference load circuit 806 at VPASS; and the buffer 824 buffers the voltage on the reference load circuit 806 as the word line unselect signal VuWL.

Signal 1212 generates a second current. For example, the control unit 816 adjusts the adjustable current source 812 of FIG. 8, which, in turn, causes the controllable current mirror 810 to generate the current $I_c'$.

Stage 1214 applies the second current to a second reference load. For example, the current $I_c'$ can be coupled to a second reference load that includes only the reference load circuit 804 of FIG. 8.

Stage 1216 buffers a second program signal (e.g., a second reference load voltage as a word line unselect voltage). For example, the buffer 822 FIG. 8 can buffer the voltage of the reference load circuit 804 and output the buffered voltage as the word line select voltage VsWL.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

What is claimed is:

1. A memory device, comprising:
   a plurality of bit lines;
   a plurality of selectors connected to the bit lines, each selector defining a gate;
   a plurality of memory strings, each memory string connected to a corresponding selector;
   a plurality of word lines connecting the memory strings; and
   a signal generator circuit configured to generate program signals on the word lines, the program signals comprising a transient state based on a coupling characteristic of the word lines and the gates of the selectors, the transient state configured to minimize coupling between the word lines and the gates of the selectors so that a state of each selector remains unchanged during the transient state.

2. The memory device of claim 1, wherein:
the signal generator circuit is configured to generate current-controlled program signals.

3. The memory device of claim 2, wherein:
the signal generator circuit comprises a closed-loop control circuit.

4. The memory device of claim 2, wherein:
the signal generator circuit comprises an open-loop control circuit.

5. The memory device of claim 1, wherein:
the program signals comprise a word line unselect signal and a word line select signal.

6. The memory device of claim 1, wherein:
the signal generator comprises:
   a reference load circuit; and
   a program signal generator circuit coupled to the reference load circuit, the program signal generator circuit configured to generate a program source signal having a controlled transient state.

7. The memory device of claim 6, wherein:
the program signal generator circuit comprises:
   a slope detector circuit configured to receive the program source signal from the reference load circuit and generate a control signal;
   an error circuit configured to receive the control signal and an error reference signal as an input, and generate an error signal; and
   a drive circuit configured to receive the error signal and generate a charge signal and apply the charge signal to the reference load circuit to generate the program source signal.

8. The memory device of claim 7, wherein:
the reference load circuit comprises a plurality of reference word lines.

9. The memory device of claim 8, wherein:
the program signal generator circuit comprises:
a switching circuit configured to connect a first reference word line and a second reference word line to the drive circuit when the program source signal is less than a pass voltage, and to disconnect the second reference word line from the drive circuit when the program signal is greater than the pass voltage.

10. The memory device of claim 9, comprising:
a buffer circuit configured to receive a voltage signal from the first reference word line and buffer the voltage signal as a word line select signal, and to receive a voltage signal from the second reference word line and buffer the voltage signal as a word line unselect signal.

11. The memory device of claim 8, wherein:
the reference word lines comprise dummy word lines.

12. The memory device of claim 6, wherein:
the program signal generator circuit comprises:
   an error circuit configured to receive a reference load circuit signal and an error reference signal as an input, and generate an error signal; and
   a drive circuit configured to receive the error signal and generate a charge signal and apply the charge signal to the reference load circuit to generate the program source signal.

13. The memory device of claim 12, wherein:
the reference load circuit comprises:
   a reference word line; and
   a reference selector line connecting a plurality of gates of corresponding reference selectors.

14. The memory device of claim 13, wherein:
the charge signal is applied to the reference word line; and
the reference load circuit signal is generated on the reference selector line.

15. The memory device of claim 12, comprising:
a buffer circuit configured to receive the program source signal from the drive circuit and buffer the program source signal as a word line select signal.

16. The memory device of claim 6, wherein:
the reference load circuit comprises a first reference load and a second reference load; and
the program signal generator circuit comprises:
   a controllable current source circuit configured to generate a first current when the program source signal is less than a pass threshold, and to generate a second current when the program source signal is greater than the pass threshold; and
   a switching circuit configured to connect the first reference load and the second reference load to the controllable current source circuit when the program source signal is less than the pass threshold, and to disconnect the second reference load from the controllable current source circuit when the program source signal is greater than the pass threshold.

17. The memory device of claim 16, further comprising:
a first buffer circuit configured to receive a voltage signal from the first reference load and buffer the voltage as a word line select signal; and
a second buffer circuit configured to a voltage signal from the second reference load and buffer the voltage signal as a word line unselect signal.

18. The memory device of claim 6, wherein:
the reference load circuit comprises a first reference load and a second reference load; and
the program signal generator circuit comprises:
   a controllable current source circuit configured to generate a first current when the program source signal is less than a fixed threshold voltage, and to generate a second current when the program source signal is greater than the fixed threshold voltage; and
   a switching circuit configured to connect the first reference load and the second reference load to the controllable current source circuit when the program source signal is less than the fixed threshold voltage, and to disconnect the second reference load from the controllable current source circuit when the program source signal is greater than the fixed threshold voltage;
wherein the first current is applied to the first reference load and the second reference load when the program source signal is less than the fixed threshold voltage, and the second current is applied to the first reference load when the program source signal is greater than the fixed threshold voltage.

19. The memory device of claim 1, wherein
the memory device comprises a NAND flash memory.

20. A method, comprising:
coupling a first gate signal to a plurality of selectors;
coupling a select signal to one of the selectors;
coupling an unselect signal to another of the selectors;
coupling program signals to word lines in coupling communication with the plurality of selectors; and controlling a transient characteristic of the program signals to minimize coupling communication between the word lines and the plurality of selectors.

21. The method of claim 20, comprising:
detecting a slope of the program signals;
adjusting a current in response to the detected slope; and
applying the current to a reference load to generate the program signals.

22. The method of claim 21, comprising:
maintaining a substantially constant slope in the program signal during the transient state.

23. The method of claim 21, comprising:
determining if the magnitude of the program signal exceeds a first value; and
adjusting the reference load upon determining that the magnitude of the program signal exceeds the first value.

24. The method of claim 21, comprising:
determining if the magnitude of a program source signal exceeds a first value during the transient state;
generating a first current if the magnitude of the program source signal does not exceed a first value during the transient state;
generating a second current if the magnitude of the program signal exceeds the first value during the transient state;
applying the first current to a first reference load and a second reference load to generate the program source signal if the program source signal does not exceed the first value; and
applying the second current only to the first reference load to generate the program source signal if the program source signal exceeds the first value.

25. The method of claim 24, comprising:
selectively buffering the program source signal as an unselect word line voltage and a select word line voltage.

26. A method, comprising:
generating a program source signal for a memory;
coupling the program source signal to a reference load having a characteristic impedance corresponding to a memory array in the memory;
monitoring a transient characteristic of the program source signal;
generating program signals from the program source signal;
coupling the program signal to word lines in the memory array; and controlling the slope of the program source signal based the monitored transient characteristic to minimize coupling between word lines and one or more selector gates in the memory array.

27. The method of claim 26, comprising:
determining if the magnitude of the program source signal exceeds a first value during the transient state;
adjusting the reference load to a first reference load if the program source signal does not exceed the first reference value; and
adjusting the reference load to a second reference load if the program source signal does exceed the first reference value.

28. The method of claim 27, comprising:
generating a first current if the magnitude of the program source signal does not exceed a first value during the transient state;
generating a second current if the magnitude of the program source signal exceeds the first value during the transient state;
applying the first current to the first reference load to generate the program source signal if the program source signal does not exceed the first value; and
applying the second current to the second reference load to generate the program source signal if the program source signal exceeds the first value.

29. The method of claim 28, comprising:
buffering a voltage from the first reference load as a word line unselect voltage; and
buffering a voltage from the second reference load as a word line select voltage.

30. The method of claim 29, wherein:
the memory comprises a NAND flash memory.

31. A system, comprising:
means for generating a program signal for a memory;
means for coupling the program signal to a word line in the memory array though a buffer;
means for coupling the program signal to a reference load having a characteristic impedance corresponding to the memory array in the memory;
means for monitoring a transient characteristic of the program signal; and
means for controlling the slope of the program signal based the monitored transient characteristic to minimize coupling between the word line and a selector gate in the memory array.

* * * * *

UNITED STATES PATENT AND TRADEMARK OFFICE
CERTIFICATE OF CORRECTION

| | | |
|---|---|---|
| PATENT NO. | : 7,505,326 B2 | |
| APPLICATION NO. | : 11/554829 | |
| DATED | : March 17, 2009 | |
| INVENTOR(S) | : Stefano Sivero et al. | |

It is certified that error appears in the above-identified patent and that said Letters Patent is hereby corrected as shown below:

In the drawings, Sheet 5, Fig. 10, in Box 1006, delete "UNSELECT" and insert -- UNSELECT SIGNAL --.

In Column 1, Line 14, delete "lines" and insert -- line --.

In Column 1, Line 63, delete "words" and insert -- word --.

In Column 2, Line 66, delete "lines" and insert -- line --.

In Column 3, Line 1, delete "106-2," and insert -- 106-2 --.

In Column 4, Line 66, delete "NAND" and insert -- a NAND --.

In Column 5, Line 61, delete "$I_s$" and insert -- $I_B$ --.

In Column 5, Line 63, delete "driver" and insert -- drive --.

In Column 6, Line 44, delete "driver" and insert -- drive --.

In Column 7, Line 19, delete "in" and insert -- at --.

In Column 8, Line 67, delete "according" and insert -- accordingly --.

In Column 10, Line 6, delete "example" and insert -- example process --.

In Column 10, Line 35, delete "Signal" and insert -- Stage --.

UNITED STATES PATENT AND TRADEMARK OFFICE
CERTIFICATE OF CORRECTION

PATENT NO. : 7,505,326 B2
APPLICATION NO. : 11/554829
DATED : March 17, 2009
INVENTOR(S) : Stefano Sivero et al.

It is certified that error appears in the above-identified patent and that said Letters Patent is hereby corrected as shown below:

In Column 12, Claim 19, Line 60, delete "wherein" and insert -- wherein: --.

In Column 13, Claim 26, Line 46, delete "signal" and insert -- signals --.

In Column 14, Claim 26, Line 1, delete "based" and insert -- based on --.

In Column 14, Claim 31, Line 37, delete "though" and insert -- through --.

In Column 14, Claim 31, Line 43, delete "based" and insert -- based on --.

Signed and Sealed this

Sixteenth Day of June, 2009

JOHN DOLL
*Acting Director of the United States Patent and Trademark Office*

UNITED STATES PATENT AND TRADEMARK OFFICE
CERTIFICATE OF CORRECTION

| | |
|---|---|
| PATENT NO. | : 7,505,326 B2 |
| APPLICATION NO. | : 11/554829 |
| DATED | : March 17, 2009 |
| INVENTOR(S) | : Stefano Sivero et al. |

It is certified that error appears in the above-identified patent and that said Letters Patent is hereby corrected as shown below:

In the drawings, Sheet 5, Fig. 10, in Box 1006, delete "UNSELECT" and insert -- UNSELECT SIGNAL --.

In Column 1, Line 14, delete "lines" and insert -- line --.

In Column 1, Line 63, delete "words" and insert -- word --.

In Column 2, Line 66, delete "lines" and insert -- line --.

In Column 3, Line 1, delete "106-2," and insert -- 106-2 --.

In Column 4, Line 66, delete "NAND" and insert -- a NAND --.

In Column 5, Line 61, delete "$I_s$" and insert -- $I_B$ --.

In Column 5, Line 63, delete "driver" and insert -- drive --.

In Column 6, Line 44, delete "driver" and insert -- drive --.

In Column 7, Line 19, delete "in" and insert -- at --.

In Column 8, Line 67, delete "according" and insert -- accordingly --.

In Column 10, Line 6, delete "example" and insert -- example process --.

In Column 10, Line 35, delete "Signal" and insert -- Stage --.

UNITED STATES PATENT AND TRADEMARK OFFICE
CERTIFICATE OF CORRECTION

PATENT NO. : 7,505,326 B2
APPLICATION NO. : 11/554829
DATED : March 17, 2009
INVENTOR(S) : Stefano Sivero et al.

It is certified that error appears in the above-identified patent and that said Letters Patent is hereby corrected as shown below:

In Column 12, Claim 19, Line 60, delete "wherein" and insert -- wherein: --.

In Column 13, Claim 26, Line 46, delete "signal" and insert -- signals --.

In Column 14, Claim 26, Line 1, delete "based" and insert -- based on --.

In Column 14, Claim 31, Line 37, delete "though" and insert -- through --.

In Column 14, Claim 31, Line 43, delete "based" and insert -- based on --.

This certificate supersedes the Certificate of Correction issued June 16, 2009.

Signed and Sealed this

Thirteenth Day of October, 2009

David J. Kappos
*Director of the United States Patent and Trademark Office*

UNITED STATES PATENT AND TRADEMARK OFFICE
CERTIFICATE OF CORRECTION

PATENT NO. : 7,505,326 B2
APPLICATION NO. : 11/554829
DATED : March 17, 2009
INVENTOR(S) : Stefano Sivero et al.

It is certified that error appears in the above-identified patent and that said Letters Patent is hereby corrected as shown below:

In the drawings, Sheet 5, Fig. 10, in Box 1006, delete "UNSELECT" and insert -- UNSELECT SIGNAL --.

In Column 1, Line 14, delete "lines" and insert -- line --.

In Column 1, Line 63, delete "words" and insert -- word --.

In Column 2, Line 66, delete "lines" and insert -- line --.

In Column 3, Line 1, delete "106-2," and insert -- 106-2 --.

In Column 4, Line 66, delete "NAND" and insert -- a NAND --.

In Column 5, Line 61, delete "$I_s$" and insert -- $I_B$ --.

In Column 5, Line 63, delete "driver" and insert -- drive --.

In Column 6, Line 44, delete "driver" and insert -- drive --.

In Column 7, Line 19, delete "in" and insert -- at --.

In Column 8, Line 67, delete "according" and insert -- accordingly --.

In Column 10, Line 6, delete "example" and insert -- example process --.

In Column 10, Line 35, delete "Signal" and insert -- Stage --.

UNITED STATES PATENT AND TRADEMARK OFFICE
CERTIFICATE OF CORRECTION

PATENT NO. : 7,505,326 B2
APPLICATION NO. : 11/554829
DATED : March 17, 2009
INVENTOR(S) : Stefano Sivero et al.

It is certified that error appears in the above-identified patent and that said Letters Patent is hereby corrected as shown below:

In Column 12, Claim 19, Line 60, delete "wherein" and insert -- wherein: --.

In Column 13, Claim 26, Line 46, delete "signal" and insert -- signals --.

In Column 14, Claim 26, Line 1, delete "based" and insert -- based on --.

In Column 14, Claim 31, Line 37, delete "though" and insert -- through --.

In Column 14, Claim 31, Line 43, delete "based" and insert -- based on --.

This certificate supersedes the Certificates of Correction issued June 16, 2009 and October 13, 2009.

Signed and Sealed this

First Day of December, 2009

David J. Kappos
*Director of the United States Patent and Trademark Office*